United States Patent
Schepis et al.

(10) Patent No.: US 7,544,994 B2
(45) Date of Patent: Jun. 9, 2009

(54) SEMICONDUCTOR STRUCTURE WITH MULTIPLE FINS HAVING DIFFERENT CHANNEL REGION HEIGHTS AND METHOD OF FORMING THE SEMICONDUCTOR STRUCTURE

(75) Inventors: Dominic J. Schepis, Wappingers Falls, NY (US); Huilong Zhu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 115 days.

(21) Appl. No.: 11/556,844

(22) Filed: Nov. 6, 2006

(65) Prior Publication Data

US 2008/0122013 A1     May 29, 2008

(51) Int. Cl.
*H01L 27/088* (2006.01)

(52) U.S. Cl. .................. 257/327; 257/347; 257/365; 257/302; 257/E25.011

(58) Field of Classification Search .............. None
See application file for complete search history.

(56) References Cited

U.S. PATENT DOCUMENTS

| | | | |
|---|---|---|---|
| 6,214,681 B1 * | 4/2001 | Yu | ............... 438/300 |
| 6,413,802 B1 | 7/2002 | Hu et al. | |
| 6,909,147 B2 | 6/2005 | Aller et al. | |
| 2004/0222477 A1 * | 11/2004 | Aller et al. | ............... 257/412 |
| 2004/0266076 A1 * | 12/2004 | Doris et al. | ............... 438/157 |
| 2005/0215014 A1 | 9/2005 | Ahn et al. | |

OTHER PUBLICATIONS

A. Breed, et al. "Dual-gate (FinFET) and Tri-Gate MOSFETs: Simulation and Design"—Semiconductor Device Research Symposium, Dec. 2003, pp. 150-151.

* cited by examiner

*Primary Examiner*—Leonardo Andujar
*Assistant Examiner*—Fei Fei Yeung Lopez
(74) *Attorney, Agent, or Firm*—Gibb I.P. Law Firm, LLC; Todd M. C. Li, Esq.

(57) ABSTRACT

Disclosed are embodiments of a semiconductor structure with fins that are positioned on the same planar surface of a wafer and that have channel regions with different heights. In one embodiment the different channel region heights are accomplished by varying the overall heights of the different fins. In another embodiment the different channel region heights are accomplished by varying, not the overall heights of the different fins, but rather by varying the heights of a semiconductor layer within each of the fins. The disclosed semiconductor structure embodiments allow different multigate non-planar FETs (i.e., tri-gate or dual-gate FETs) with different effective channel widths to be formed of the same wafer and, thus, allows the beta ratio in devices that incorporate multiple FETs (e.g., static random access memory (SRAM) cells) to be selectively adjusted.

21 Claims, 12 Drawing Sheets

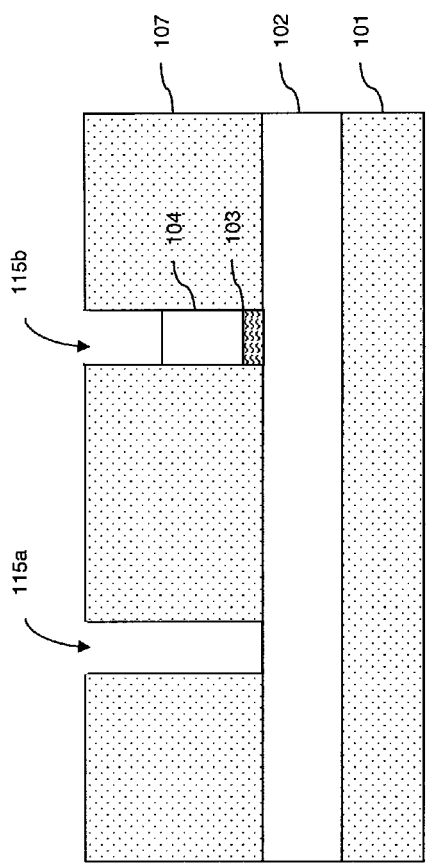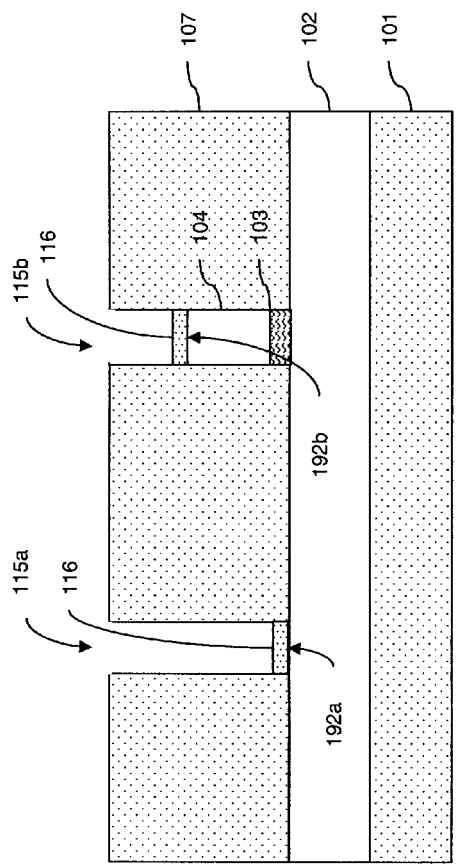

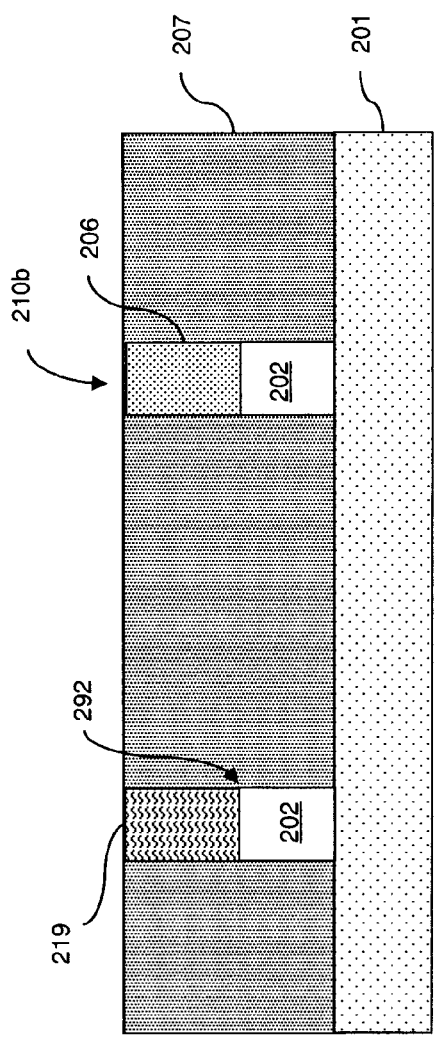
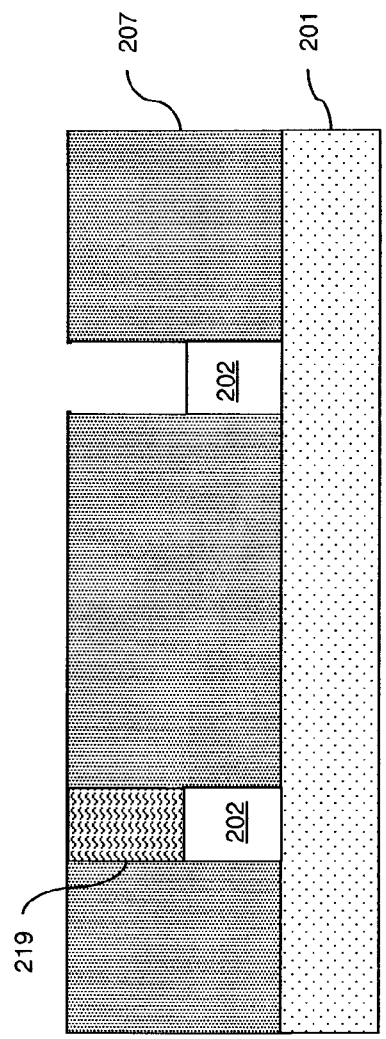

SEMICONDUCTOR STRUCTURE WITH MULTIPLE FINS HAVING DIFFERENT CHANNEL REGION HEIGHTS AND METHOD OF FORMING THE SEMICONDUCTOR STRUCTURE

BACKGROUND

1. Field of the Invention

The embodiments of the invention generally relate to field effect transistors and, more particularly, to fin-type field effect transistors having different channel region heights and, thus, different effective channel widths.

2. Description of the Related Art

As transistor design is improved and evolves, the number of different types of transistors continues to increase. Multi-gate non-planar metal oxide semiconductor field effect transistors (FETs), including dual-gate non-planar FETs (e.g., finFETs) and tri-gate non-planar FETs, were developed to provide scaled devices with faster drive currents and reduced short channel effects over planar FETs.

Dual-gate non-planar FETs are FETs in which a channel region is formed in the center of a thin semiconductor fin. The source and drain regions are formed in the opposing ends of the fin on either side of the channel region. Gates are formed on each side of the thin semiconductor fin, and in some cases, on the top or bottom of the fin as well, in an area corresponding to the channel region. FinFETs are a type of dual-gate non-planar FETs in which the fin is so thin as to be fully depleted. The effective fin width is determined by the fin height (e.g., wide fins can cause partial depletion of a channel). For a finFET, a fin thickness of approximately two-third the length of the gate (or less) can ensure suppression of deleterious short-channel effects, such as variability in threshold voltage and excessive drain leakage currents. Fin-FETs are discussed at length in U.S. Pat. No. 6,413,802 to Hu et al., which is incorporated herein by reference Tri-gate non-planar FETs have a similar structure to that of dual-gate non-planar FETs; however, the fin width and height are approximately the same so that gates can be formed on three sides of the channel, including the top surface and the opposing sidewalls. The height to width ratio is generally in the range of 3:2 to 2:3 so that the channel will remain fully depleted and the three-dimensional field effects of a tri-gate FET will give greater drive current and improved short-channel characteristics over a planar transistor. For a detail discussion of the structural differences between dual-gate and tri-gate FETs see "Dual-gate (finFET) and Tri-Gate MOS-FETs: Simulation and Design" by A Breed and K. P. Roenker, Semiconductor Device Research Symposium, 2003, pages 150-151, December 2003 (incorporated herein by reference).

Recently, static random access memory (SRAM) cells (e.g., 6T-SRAM cells having two pass-gate transistors, two pull-up transistors and two pull-down transistors) have incorporated such multi-gate non-planar FETs. SRAM cells are typically designed with stronger pull-down strength, where the width ratio of pull-down (drive) FETs to pass-gate (load) FETs (i.e., the beta ratio) is greater than approximately two. One method of achieving such a beta ratio (i.e. a greater effective channel width in the pull-down transistors as compared to the pass-gate transistors) in an SRAM cell is by incorporating multiple fins into the pull-down FETs and/or pass-gate FETs (e.g., to achieve a ratio of 2:1). However, due to the conventional lithographic techniques used to pattern semiconductor fins, it may be difficult to fit the multiple fins required within the allotted space. Additionally, frequency doubling of fin pitch is not easily achieved using current state of the art lithographic technology, and thus, multi-gate non-planar FET SRAM cells may be compromised for either density or performance.

Therefore, there is a need in the art for an improved semiconductor structure and an associated method of forming the structure that allows a greater effective channel width to be achieved in one multi-gate non-planar transistor as compared to another on the same wafer.

SUMMARY

In view of the foregoing, disclosed herein are embodiments of an improved semiconductor structure that comprises semiconductor fins with different channel region heights on the same wafer. These fins with different channel region heights allow different multi-gate non-planar field effect transistors with different effective channel widths to be formed on the same wafer and, thus, optionally, to be incorporated into the same device (e.g., a single static random access memory (SRAM) cell).

An embodiment of the semiconductor structure comprises first and second fins on an isolation layer. These fins have approximately equal overall heights. Each fin comprises a semiconductor layer adjacent to the isolation layer and at least one additional layer above the semiconductor layer. However, the height of the semiconductor layer of the first fin is less than the height of the semiconductor layer of the second fin. Specifically, in the first fin, the semiconductor layer comprises a single layer of semiconductor material (e.g., silicon) above the isolation layer. In the second fin, the semiconductor layer comprises multiple layers of semiconductor materials (e.g., a silicon layer, a silicon germanium layer, another silicon layer, etc.).

Additionally, depending upon whether the fins will be incorporated into tri-gate or dual-gate non-planar FETs, the composition of the additional layers will vary. For example, for tri-gate FETs, the additional layers can comprise a dielectric layer adjacent to the semiconductor layer and a conductor layer (e.g., a metal layer, a doped semiconductor layer, such as a doped polysilicon or doped polysilicon germanium layer, etc.) on the dielectric layer. Alternatively, for dual-gate FETs, the additional layers can comprise multiple dielectric layers.

An embodiment of the method of forming the semiconductor structure, described above, comprises providing a wafer with a first semiconductor layer on an isolation layer (e.g., a silicon-on-insulator (SOI) wafer). A second different semiconductor layer (e.g., a silicon germanium layer) can be formed on the first semiconductor layer. Optionally, one or more third semiconductor layers can be formed on the second semiconductor layer.

The combined thickness of all of the semiconductor layers as compared to that of the first semiconductor layer alone is predetermined, during this process, to ensure the desired beta ratio for the subsequently formed semiconductor structure. Then, one or more cap layers can be formed above the various semiconductor layers.

Next, multi-layer identical fins can be patterned and etched into the wafer stopping at the first semiconductor layer. Thus, each of the multi-layer fins comprises portions of the second semiconductor layer, the optional third semiconductor layer and the cap layer. Once the multi-layer fins are formed, a sacrificial material can be deposited over the multi-layer fins and planarized to expose the top surface of the cap layer. Then, one of the multi-layer fins can be removed such that a first trench is formed in the sacrificial material. The cap layer from another of the multi-layer fins can also be removed such that a second trench is formed in the sacrificial material.

Once the first and second trenches are formed in the sacrificial material, they are filled with at least one additional layer. Depending upon whether the semiconductor structure being formed will be incorporated into a device with tri-gate or dual-gate non-planar FETs, the composition of the additional layers will vary. For example, for tri-gate FETs, the additional layers are formed by forming a dielectric layer (e.g., a thin gate oxide layer) on the bottom surfaces of the first and second trenches and, then, by forming a conductor layer (e.g., metal, doped polysilicon, doped polysilicon germanium, etc.) on the dielectric layer. For dual-gate FETs, the additional layers can be formed by forming multiple dielectric layers.

After the additional layers are formed, the sacrificial material and the first semiconductor layer are selectively and anisotropically etched stopping on the isolation layer. Thus, a first fin, comprising portions of the first semiconductor layer and the additional layer(s), and a second fin, comprising portions of the first semiconductor layer, the second semiconductor layer, the optional third semiconductor layer and the additional layer(s), are formed above the isolation layer. Due to the processes, described above, the first and second fins will have approximately the same overall height, but the combined height of the semiconductor layers within the fins will be different.

Another embodiment of the semiconductor structure comprises a wafer with an isolation layer that has a planar top surface and first and semiconductor fins on the planar top surface. The first semiconductor fin can extend vertically to a first height above the planar top surface, whereas the second fin can extend vertically to a second different height above the planar top surface. Specifically, both the first semiconductor fin and second semiconductor fin can each comprise a semiconductor layer (e.g., a silicon layer) adjacent to the isolation layer. This semiconductor layer can have approximately the same thickness in each of the fins. However, to achieve a greater height in the first fin, the first fin can further comprise an epitaxial semiconductor layer (e.g., an epitaxial silicon or epitaxial silicon germanium layer) on the semiconductor layer.

An embodiment of the method of forming the semiconductor structure, described above, comprises providing a wafer with a semiconductor layer on an isolation layer. A cap layer can be deposited on the semiconductor layer. The combined thickness of the semiconductor layer and cap layer as compared to that of the semiconductor layer alone is predetermined, during this process, to ensure the desired beta ratio for the subsequently formed semiconductor structure.

Then, multi-layer identical fins can be patterned and etched into the wafer stopping on the isolation layer. Thus, each of the multi-layer fins comprises portions of the semiconductor layer and the cap layer. Once the multi-layer fins are formed, a sacrificial material (e.g., an oxide) can be deposited and planarized to expose the cap layer. The cap layer can be removed from one of the multi-layer fins such that a trench is formed in the sacrificial material. This trench can then be filled with a semiconductor material (e.g., by epi growth of silicon or silicon germanium from the top surface of the semiconductor layer exposed at the bottom of the trench). After the trench is filled, the cap layer from another one of the multi-layer fins as well as the sacrificial material can be selectively removed such that a first semiconductor fin and a second semiconductor fin are formed on the planar top surface of the insulator layer. Due to the processes, described above, the first semiconductor fin will extend a first height above the planar top surface of the insulator layer, whereas the second semiconductor fin will extend a second different height above the planar top surface of the insulator layer.

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which:

FIG. 1 is a schematic diagram illustrating a semiconductor structure 100a;

FIG. 8 is schematic diagram illustrating a partially completed semiconductor structure 100a, 100b;

FIG. 9 is schematic diagram illustrating a partially completed semiconductor structure 100a, 100b;

FIG. 10 is schematic diagram illustrating a partially completed semiconductor structure 100a;

FIG. 18 is schematic diagram illustrating a partially completed semiconductor structure 200; and FIG. 19 is schematic diagram illustrating a partially completed semiconductor structure 200.

DETAILED DESCRIPTION OF PREFERRED EMBODIMENTS

Figure 1:
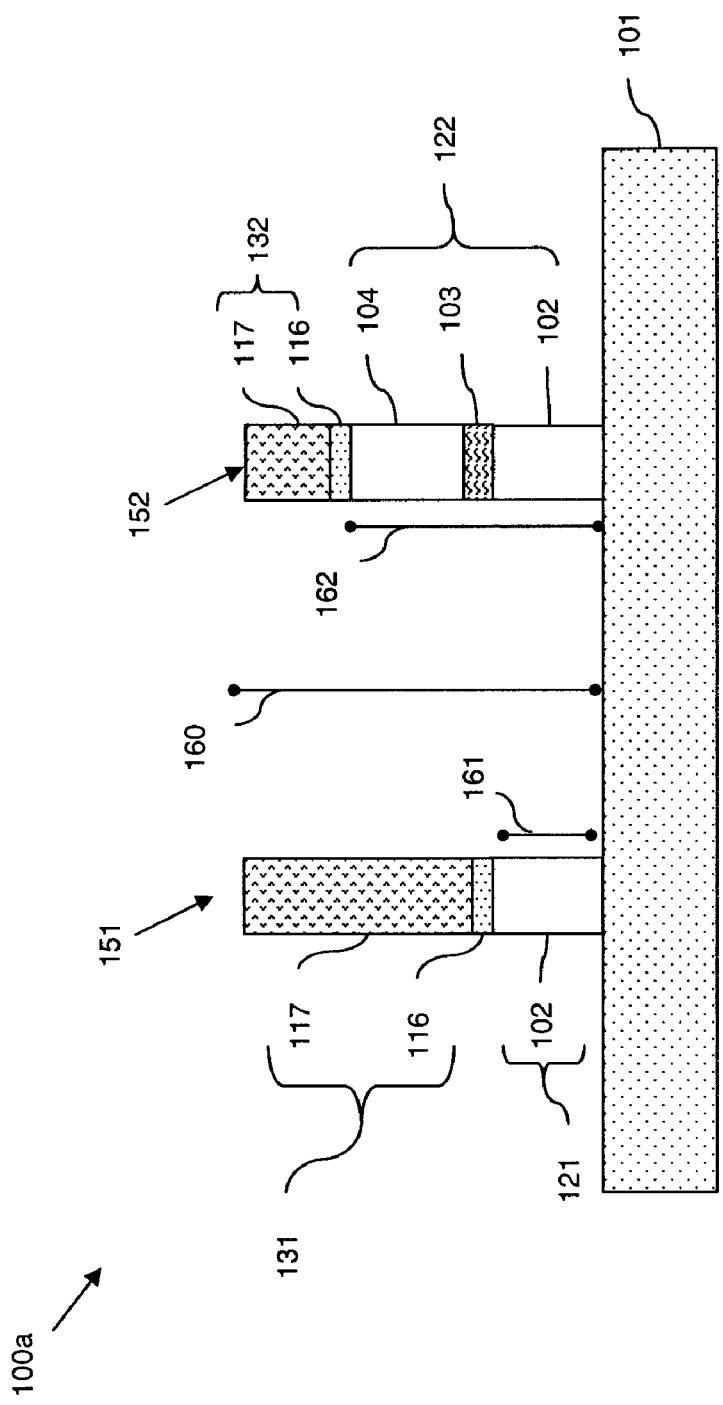

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

Recently, static random access memory (SRAM) cells have incorporated multi-gate non-planar FETs. These SRAM cells can be formed, for example, using silicon-on-insulator (SOI) wafers, bulk wafers or hybrid orientation (HOT) wafers. Typically, such SRAM cells comprise two first type (e.g., n-type) pass-gate field effect transistors (FETs), two second type (e.g., p-type) pull-up FETs and two first type (e.g., n-type) pull-down FETs. For illustration purposes, embodiments of the SRAM cell are described herein with the pass-gate FETs and pull-down FETs being n-FETs and with the pull-up FETs being p-FETs. However, those skilled in the art will recognize that such SRAM cells can, alternatively, be formed with the pass-gate FETs and pull-down FETs being p-FETs and with the pull-up FETs being n-FETs. Furthermore, such SRAM cells are typically designed with stronger pull-down strength, where the width ratio of pull-down (drive) FETs to pass-gate (load) FETs (i.e., the beta ratio) is greater than approximately two. One method of achieving such a beta ratio (i.e. a greater effective channel width in the pull-down transistors as compared to the pass-gate transistors) in an SRAM cell is by incorporating multiple fins into the pull-down FETs and/or pass-gate FETs (e.g., at a ratio of 2:1). However, due to the conventional lithographic techniques used to pattern semiconductor fins, it may be difficult to fit the multiple fins required within the allotted space. Additionally, frequency doubling of fin pitch is not easily achieved using current state of the art lithographic technology, and thus, multi-gate non-planar FET SRAM cells may be compromised for either density or performance.

Therefore, there is a need in the art for an improved semiconductor structure and an associated method of forming the structure that allows a greater effective channel width to be achieved in pull-down FETs as compared to pass-gate FETs in the same multi-gate non-planar FET SRAM cell. One method of increasing the effective channel width of a non-planar FET is to increase the height of the semiconductor body (i.e., the height of the fin) that forms the channel and source/drain regions of the transistor. Consequently, the effective channel width of adjacent FETs on the same wafer can be varied by varying the heights of the fins that are incorporated into those transistors. U.S. Pat. No. 6,909,147 issued to Aller et al. on Jun. 21, 2005 and incorporated herein by reference discloses a semiconductor structure with semiconductor fins having different heights and a method of forming the structure. The semiconductor structure and method of Aller are suitable for the purpose for which they are disclosed. However, it would be advantageous to provide an improved semiconductor structure with semiconductor fins having different heights as well as an alternative method of forming such structure.

In view of the foregoing, disclosed herein are embodiments of an improved semiconductor structure that comprises semiconductor fins with different channel region heights on the same wafer. These fins with different channel region heights allow different multi-gate non-planar field effect transistors with different effective channel widths to be formed on the same wafer and, thus, to be incorporated into the same device (e.g., a static random access memory (SRAM) cell).

Figure 2:
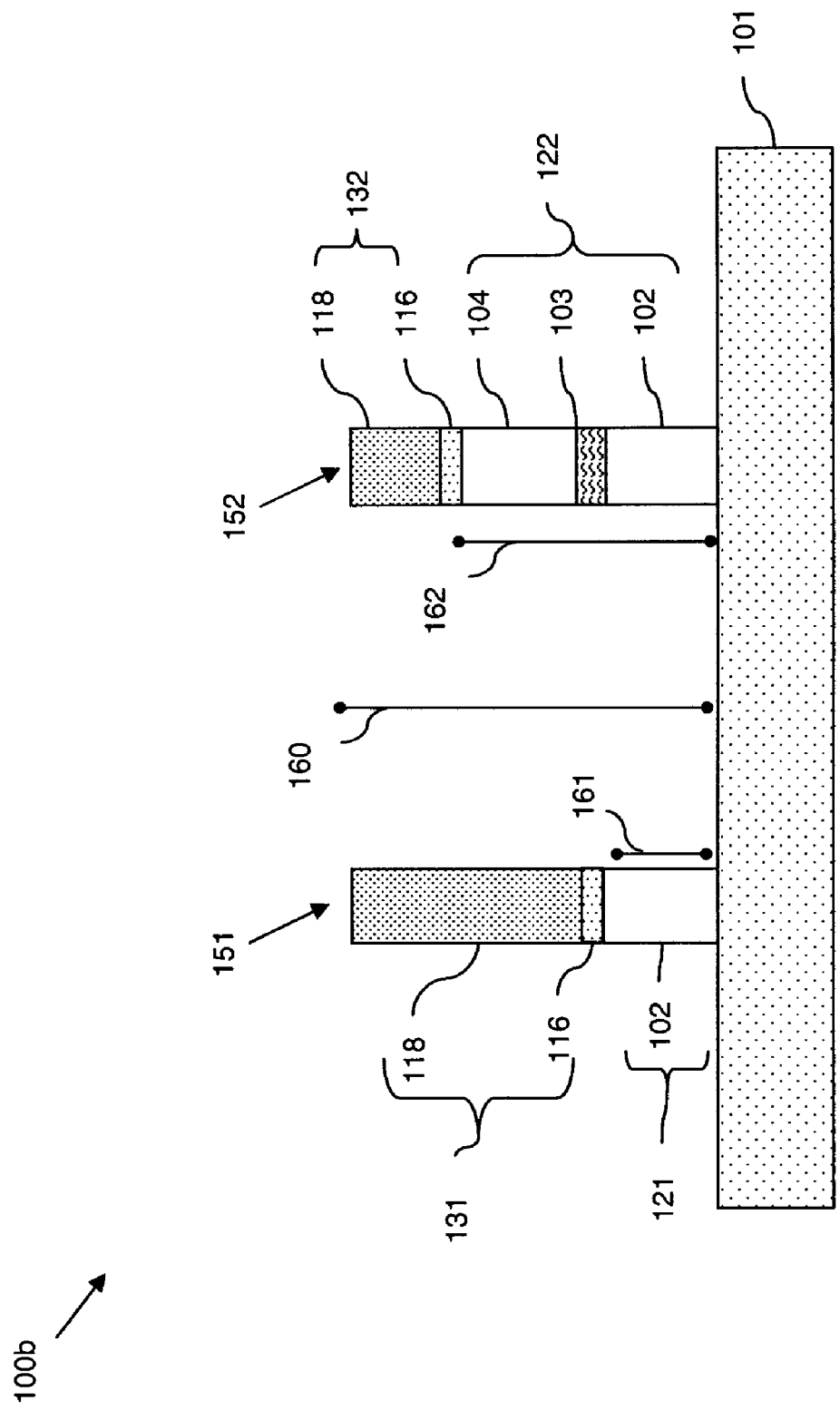
FIG. 2 is a schematic diagram illustrating a semiconductor structure 100b.

Referring to FIGS. 1 and 2, an embodiment of the semiconductor structure 100a, 100b of the invention comprises first and second fins 151, 152 on an isolation layer 101 (e.g., on the top surface of a planar buried oxide layer). These fins (i.e., the first and second fin 151, 152) have approximately equal overall heights 160 above the isolation layer 101. Each fin 151, 152 comprises a semiconductor layer 121, 122 adjacent to the isolation layer 101 and at least one additional layer 131, 132 above the semiconductor layer. However, the height above the isolation layer 101 of the semiconductor layer 121 of the first fin 151 (i.e., a first height 161) is less than the height above the isolation layer 101 of the semiconductor layer 122 of the second fin 152 (i.e., a second height 162). More specifically, in the first fin 151, the semiconductor layer 121 comprises a single layer of semiconductor material (e.g., a silicon layer 102) above the isolation layer 101. In the second fin 152, the semiconductor layer 122 comprises multiple layers 102-104 of semiconductor materials (e.g., a silicon layer 102 with the same thickness as the single layer of silicon in the first fin 151, a thin layer of silicon germanium 103 above the silicon layer 102, another layer of silicon 104 above the silicon germanium 103, etc.) above the isolation layer 101. Thus, the height of the semiconductor layer 121 of the first fin 151 (i.e., a first height 161) is less than the height of the semiconductor layer 122 of the second fin 152 (i.e., a second height 162).

Consequently, given that the overall heights 160 of the fins 151, 152 are approximately equal, but that the heights 161, 162 of the semiconductor layer 121, 122 in the different fins 151, 152 are different, the height of the additional layer(s) 131 in the first fin 151 is necessarily greater than the height of the additional layer(s) 132 in the second fin 152.

Additionally, depending upon whether the fins 151, 152 will be incorporated into tri-gate or dual-gate non-planar FETs with different effective channel widths during subsequent processing, the composition of the additional layers 131, 132 of the first and second fins 151, 152, respectively, will vary. For example, as illustrated in structure 100a of FIG. 1, for tri-gate FETs (i.e., FETs having a gate on the top surface and sidewalls of the fin), the additional layers 131, 132 can comprise a dielectric layer 116 (e.g., a thin gate oxide layer) adjacent to the semiconductor layer 121, 122 of each fin and a conductor layer 117 (e.g., a metal layer, a doped semiconductor layer, such as a doped polysilicon or doped polysilicon germanium layer, etc.) on the dielectric layer 116. Alternatively, as illustrated in structure 100b of FIG. 2, for dual-gate FET (i.e., FETs having gates on only the sidewalls of the fin), the additional layers 131, 132 can comprise multiple dielectric layers 116-118, such as first dielectric layer 116 (e.g., a thin oxide layer) adjacent to the semiconductor layer 121, 122 of each fin and a second dielectric layer 118 (e.g., a thick nitride layer) on the first dielectric layer 116.

It should be noted that the relative difference in the height 161 of the semiconductor layer 121 in the first fin 151 and height 162 of the semiconductor layer 122 in the second fin 152 can be predetermined to achieve a desired beta ratio. For example, if the first fin 151 is to be incorporated into a pass-gate (load) FET and the second fin 152 is to be incorporated into a pull-down (drive) FET, then the ratio of height 161 of semiconductor layer 121 of the first fin 151 to the height 162 of the semiconductor layer 122 of the second fin 152 should be approximately 1:2. Thus, the beta ratio will be approximately two.

Figure 3:
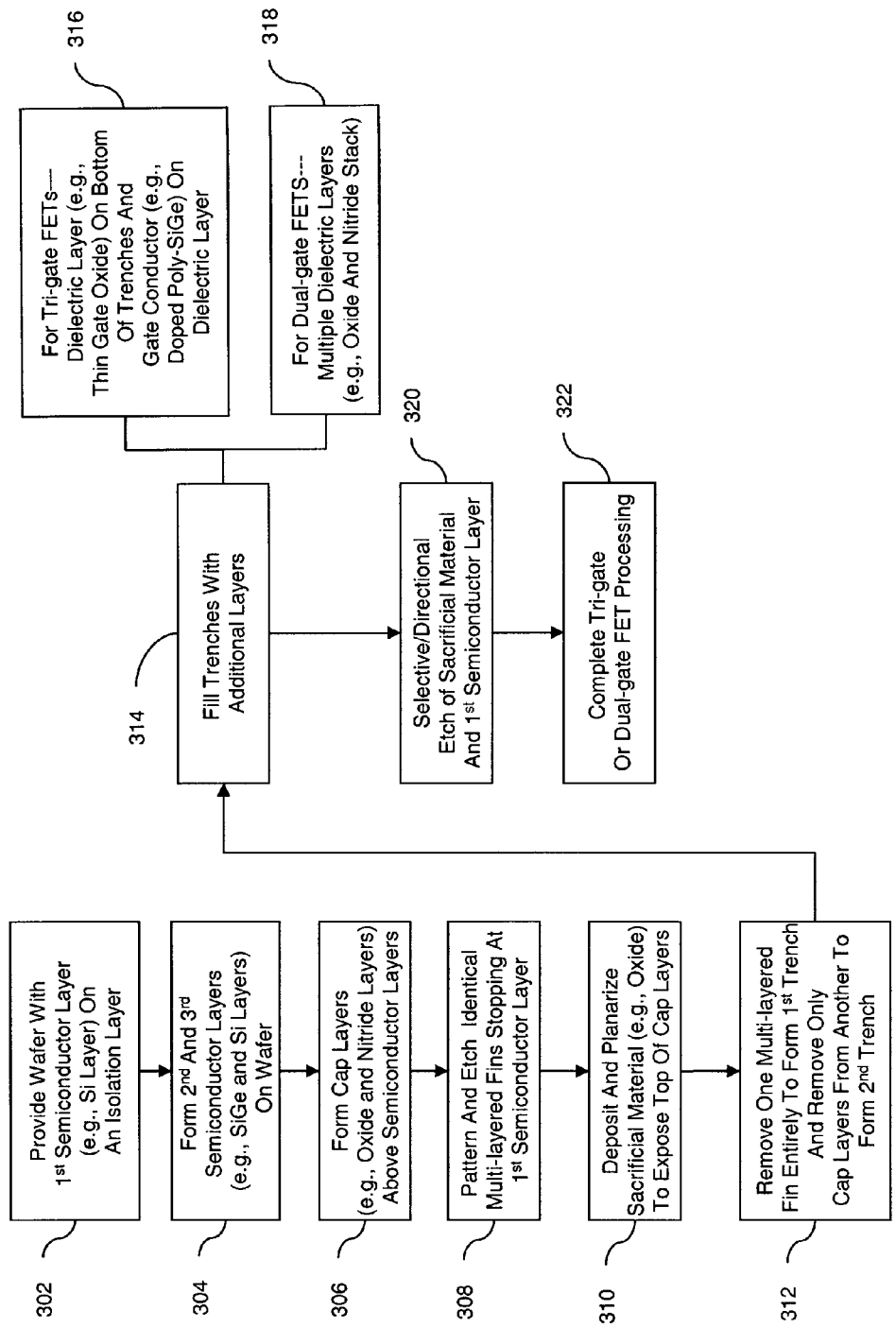
FIG. 3 is a flow diagram illustrating embodiments of a method of forming a semiconductor structure 100a or 100b.

Referring to FIG. 3, an embodiment of the method of forming the semiconductor structures 100a-b, described above and illustrated in FIGS. 1-2, comprises providing a wafer with a first semiconductor layer 102 on an isolation layer 101 (e.g., a silicon-on-insulator (SOI) wafer) (302, see FIG. 3).

Figure 4:
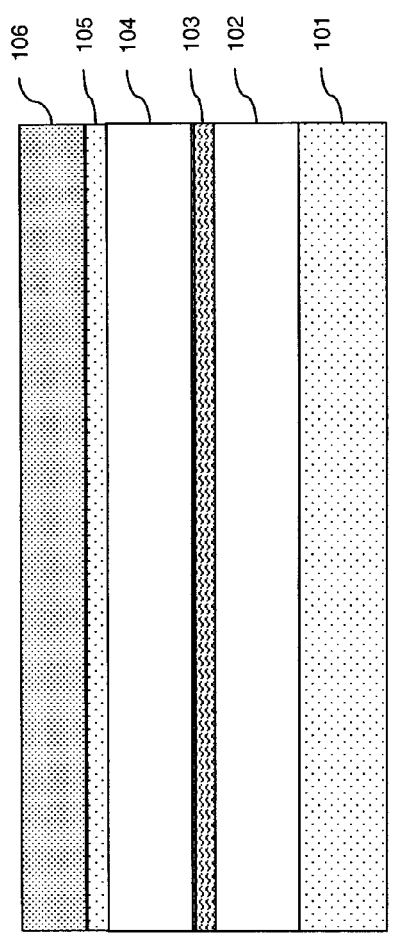
FIG. 4 is schematic diagram illustrating a partially completed semiconductor structure 100a, 100b.

A second semiconductor layer 103 that comprises a different semiconductor material than the first semiconductor layer 102 can be formed on the first semiconductor layer 102 (304). For example, a thin (e.g., approximately 5-10 nm) single crystalline silicon germanium layer with approximately 1-5% germanium can be epitaxially grown on the first semiconductor layer 102. Optionally, one or more third semiconductor layers 104 can be formed on the second semiconductor layer 103. For example, a thick (e.g., approximately 20-50 nm) single crystalline silicon layer can be epitaxially grown on the silicon germanium layer 103 such that a silicon/silicon germanium/silicon stack is formed. The combined thickness of the silicon/silicon germanium/silicon stack 102-104 as compared to that of the first silicon layer 102 alone is predetermined, during process 304, to ensure the desired beta ratio for a subsequently formed semiconductor device (e.g., SRAM) that will incorporate the subsequently formed semiconductor structure 100a or 100b. For example, for a beta ratio of two in a static random access memory (SRAM) cell, the thickness of stack 102-104 should be approximately twice that of the first silicon layer 102. Following formation of the multiple semiconductor layers 102-104 at process 304, one or more cap layers 105-106 (see FIG. 4) can be formed on the wafer (306). For example, a thin (e.g., approximately 5-10 nm) blanket oxide layer can be deposited. Then, a thick (e.g., approximately 10-30 nm) blanket nitride layer can be deposited.

Figure 5:
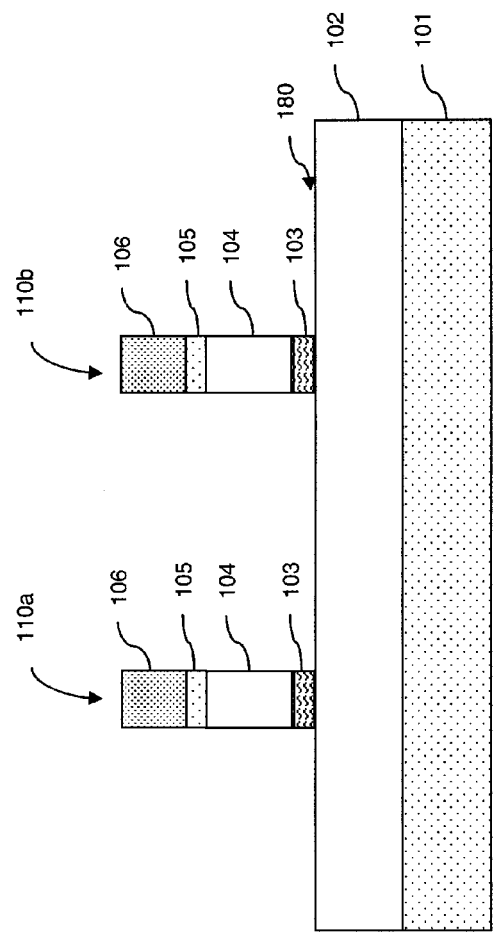
FIG. 5 is schematic diagram illustrating a partially completed semiconductor structure 100a, 100b.

Next, multi-layer identical fins 110a-b can be formed in the wafer such that they extend vertically from the top surface 180 of the first semiconductor layer 102 (308, see FIG. 5). Formation of these identical multi-layer fins 110a-b can be accomplished using conventional processing techniques. For example, a photoresist layer can be deposited onto the cap layer 106. The photoresist layer can then be lithographically patterned. Following lithographic patterning, multiple reactive ion etch (RIE) processes can be performed to selectively and directionally etch the nitride layer 106, the oxide layer 105, the silicon layer 104 and the silicon germanium layer 103 stopping at the silicon layer 102. Following, the selective RIE processes, the photoresist layer can be removed. Thus, each of the identical multi-layer fins 110a-b comprises portions of the second semiconductor layer 103, the third semiconductor layer 104 and the cap layers 105-106.

Figure 6:
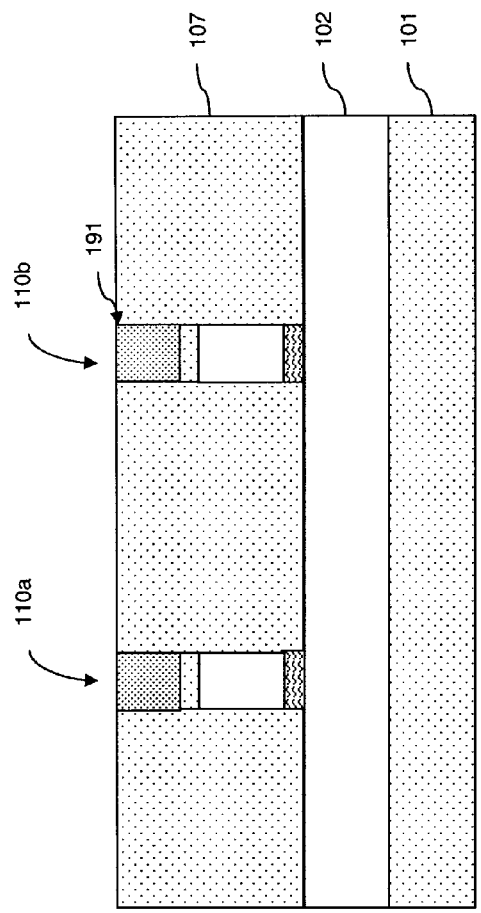
FIG. 6 is schematic diagram illustrating a partially completed semiconductor structure 100a, 100b.

Once the multi-layer fins 110a-b are formed above the first semiconductor layer 102, a sacrificial material 107 is deposited over the multi-layer fins 110a-b and planarized to expose the top surface 191 of the cap layer 106 (310, see FIG. 6). The sacrificial material 107 can, for example, comprise a dielectric material, such as a high density plasma (HDP) oxide which has good filling characteristics so as to completely fill the narrow spaces between the fins 110a-b.

Figure 7:
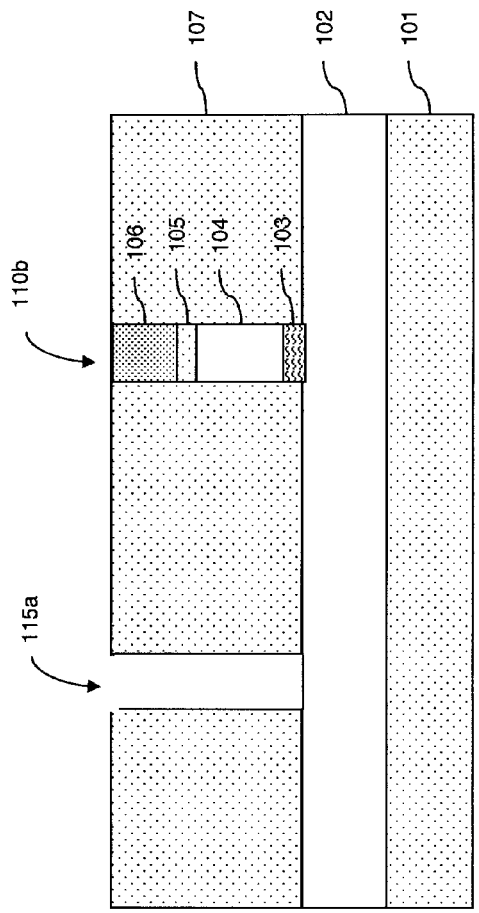
FIG. 7 is schematic diagram illustrating a partially completed semiconductor structure 100a, 100b.

Next, one of the multi-layer fins (e.g., fin 110a) is removed such that a first trench 115a is formed in the sacrificial material 107 (312, see FIG. 7). Removal of the fin 110a can be accomplished, for example, by masking fin 110b (e.g., with a patterned photo resist) and performing multiple reactive ion etch (RIE) processes to selectively remove the different layers 103-106 within the fin 110a. Those skilled in the art will recognize that the RIE process used to remove the oxide layer 105 from the fin 110a will also etch back the sacrificial material 107 if that material is an oxide. However, as mentioned above, the oxide layer 105 is preferably a very thin (e.g., approximately 5-10 nm) layer and etching back the sacrificial material to this degree will have negligible effects on the completed semiconductor structure 100a or 100b. Once, the multi-layer fin 110a is completely removed. The mask above the fin 110b is removed. Then, the cap layers 105-106 from fin 110b are also removed (e.g., by multiple RIE processes) such that a second trench 115b is formed in the sacrificial material 107 (312, see FIG. 8). Since only the cap layers 105-106, as opposed to the entire fin 110b, are removed to form the second trench 115b, the first trench 115a will be deeper than the second trench 1115b.

Once the first and second trenches 115a-b are formed, they are filled with at least one additional layer (314). Depending upon whether the semiconductor structure being formed is to be incorporated into a device with tri-gate or dual-gate FETs, the composition of the additional layers will vary.

Figure 10:
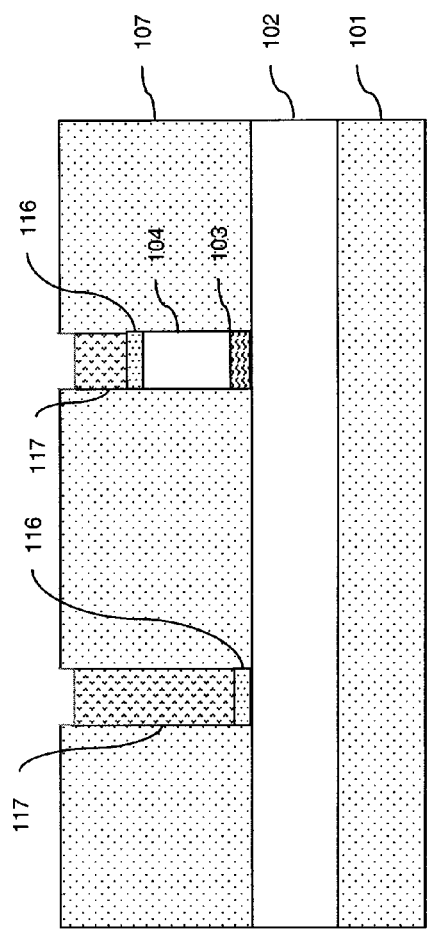

For example, to complete the structure 100a of FIG. 1 that can be used to form multiple tri-gate non-planar FETs with different effective channel widths on the same wafer, the additional layers are formed by forming a dielectric layer 116 on the bottom surfaces 192a-b of the first and second trenches 115a-b, respectively, and, then, by forming a conductor layer 117 on the dielectric layer 116 (316, see FIGS. 9-10). Specifically, an approximately 1-2 nm gate oxide layer can be formed on the bottom surfaces 192a-b of the trenches 115a-b using a conventional thermal oxidation process. Then, the conductor layer 117 can be formed on the dielectric layer 116 by depositing and planarizing and/or etching back a conductive material (e.g., a metal). Alternatively, the conductor layer 117 can be formed on the dielectric layer by depositing and planarizing and/or etching back a semiconductor material (e.g., polysilicon, polysilicon germanium with approximately 1-5% germanium, etc.). The semiconductor material can be made conductive by doping with the appropriate first type dopant (e.g., an n-type dopant, such as phosphorus (P), antimony (Sb) or arsenic (As)) or second type dopant (e.g., a p-type dopant, such as boron (B)) using a conventional ion implantation process. If necessary, the conductor layers 117 in the different trenches 115a-b may be doped with different type dopants by performing separate masked implantation processes.

Figure 11:
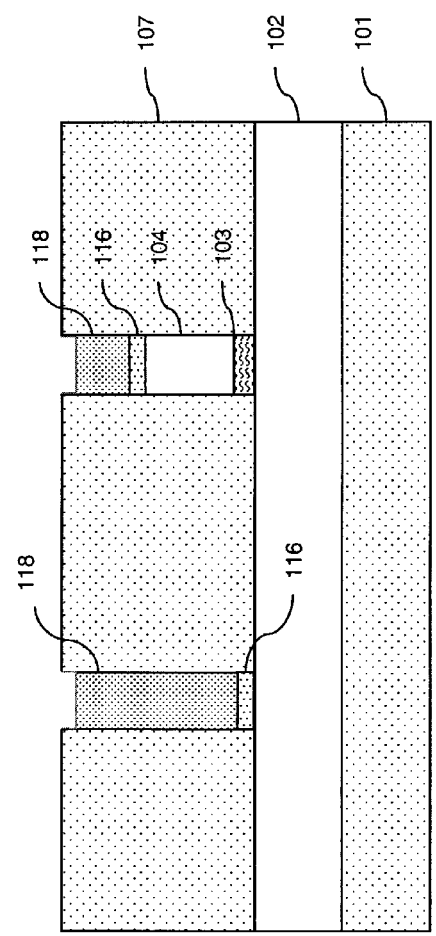
FIG. 11 is schematic diagram illustrating a partially completed semiconductor structure 100b.

Alternatively, to complete the structure 100b of FIG. 2 that can be used to form multiple dual-gate non-planar FETs with different effect channel widths on the same wafer, the additional layers can be formed by forming multiple dielectric layers 116 and 118 within the trenches 115a-b (318, see FIGS. 9 and 11). For example, a first dielectric layer 116 (e.g., an approximately 1-2 nm oxide layer) can be formed (e.g., by thermal oxidation) on the bottom surfaces 192a-b of the first and second trenches 115a-b and, then, a second dielectric layer 118 can be formed on the first dielectric layer 116. The second dielectric layer 118 can be formed, for example, by depositing a nitride layer and planarizing and/or etching back the nitride layer.

After the additional layers are formed at process 314, the sacrificial material 107 and the first semiconductor layer 102 are selectively and anisotropically etched, stopping at the isolation layer 101 (320). This etching process 320 results in a first fin 151 and a second fin 152 extending vertically from the isolation layer 101 (see structure 100a of FIG. 1, 100b of FIG. 2 and detail descriptions thereof, above).

Following formation of the structure 100a of FIG. 1 or 100b of FIG. 2, additional conventional processing techniques are performed (e.g., gate oxide formation on the fin sidewalls by thermal oxidation, gate conductor deposition and patterning, source/drain extension formation, halo formation, spacer formation, source/drain region formation, deposition and planarization of a blanket dielectric layer, contact formation, etc.) so as to complete the FET structures having different effective channel widths on the same wafer and, optionally, within the same device (e.g., within a single static random access memory (SRAM) cell).

Figure 12:
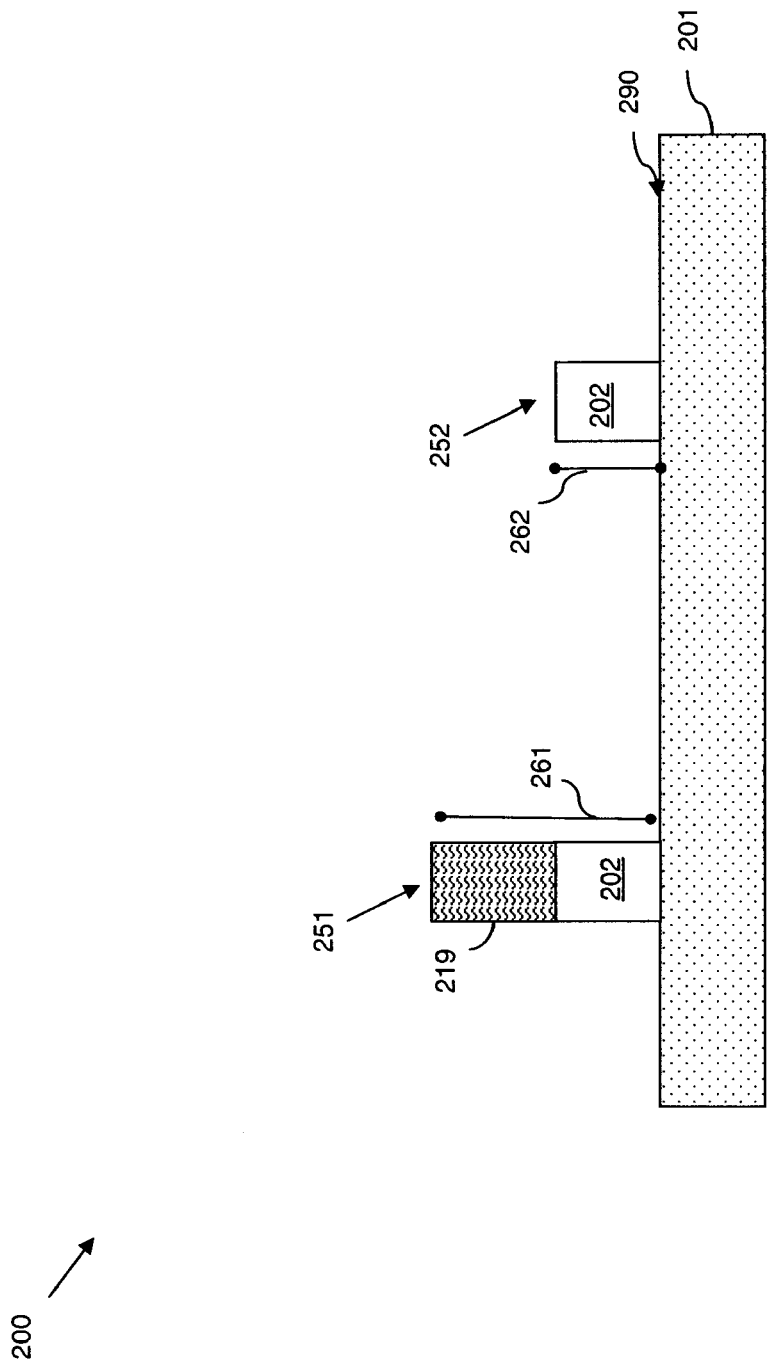
FIG. 12 is a schematic diagram illustrating a semiconductor structure 200.

Referring to FIG. 12, another embodiment of the semiconductor structure 200 of the invention comprises a wafer with an isolation layer 201 that has a planar top surface 290 and first and second semiconductor fins 251, 252 on the planar top surface 290. The first semiconductor fin 251 can extend vertically to a first height 261 above the planar top surface 290, whereas the second fin 252 can extend vertically to a second different height 262 above the planar top surface 290 (e.g., the first height 261 can be greater than the second height 262).

In structure 200, the first semiconductor fin 251 and second semiconductor fin 252 can each comprise a first semiconductor layer 202 (e.g., a silicon layer) adjacent to the isolation layer 201. This first semiconductor layer can have approximately the same thickness in each of the fins 251, 252. However, to achieve the greater height in the first fin 251, the first fin 251 can further comprise an epitaxial semiconductor layer 219 (e.g., an epitaxial silicon or epitaxial silicon germanium layer) on the first semiconductor layer 202.

It should be noted that the relative difference in the height 261 of the first fin 251 and height 262 of the second fin 252 can be predetermined to achieve a desired beta ratio. For example, if the second fin 252 is to be incorporated into a pass-gate (load) FET and the first fin 251 is to be incorporated into a pull-down (drive) FET, then the ratio of height 262 of the second fin 252 to the height 261 of the first fin 251 should be approximately 1:2. Thus, the beta ratio will be approximately two.

Figure 13:
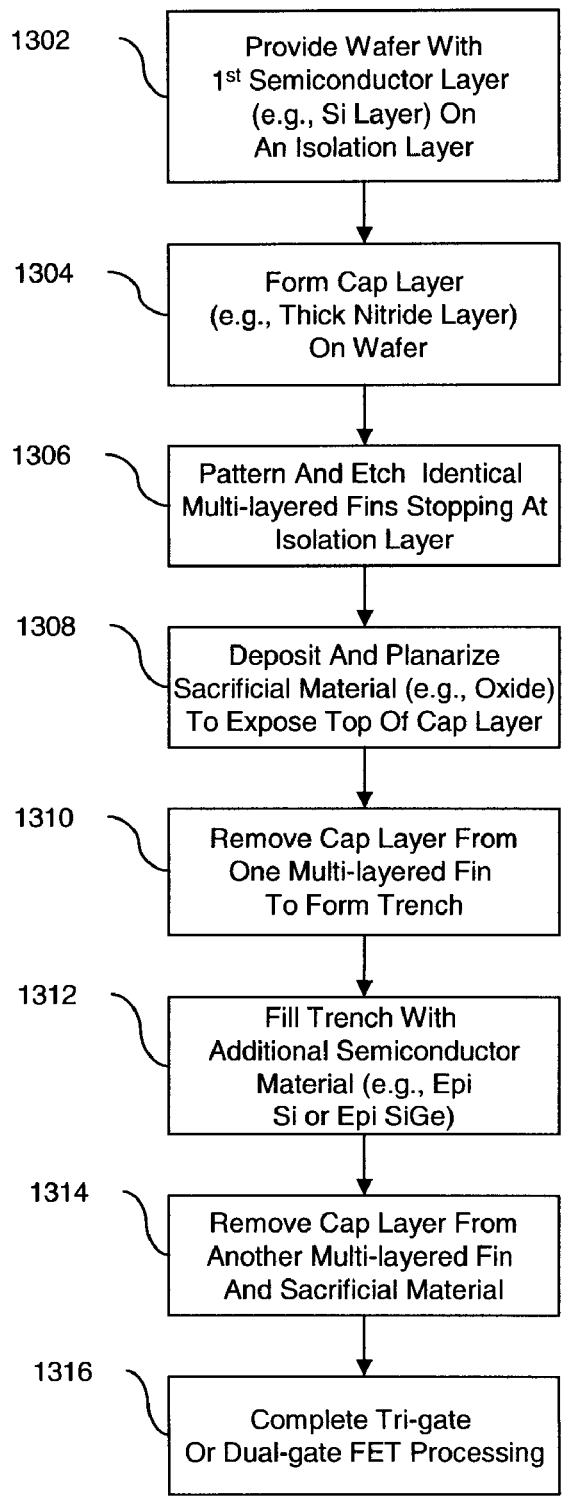
FIG. 13 is a flow diagram illustrating an embodiment of a method of forming a semiconductor structure 200.
Figure 14:
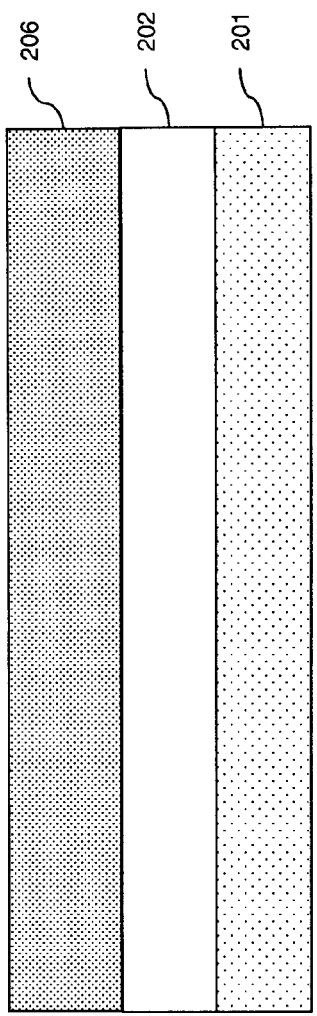
FIG. 14 is schematic diagram illustrating a partially completed semiconductor structure 200.

Referring to FIG. 13, an embodiment of the method of forming the semiconductor structure 200, described above, comprises providing a wafer comprising a semiconductor layer 202 on an isolation layer 201 (e.g., a silicon-on-insulator (SOI) wafer). A cap layer 206 (e.g., a thick nitride layer) can be deposited on the semiconductor layer 202 and planarized (1304, see FIG. 14). The combined thickness of the cap layer-semiconductor layer 202-206 stack as compared to that of the semiconductor layer 202 alone is predetermined, during process 1304, to ensure the desired beta ratio for the subsequently formed device (e.g., SRAM) that will incorporate the semiconductor structure 200. For example, for a beta ratio of 2, the thickness of stack 202-206 should be approximately twice that of the semiconductor layer 202.

Figure 15:
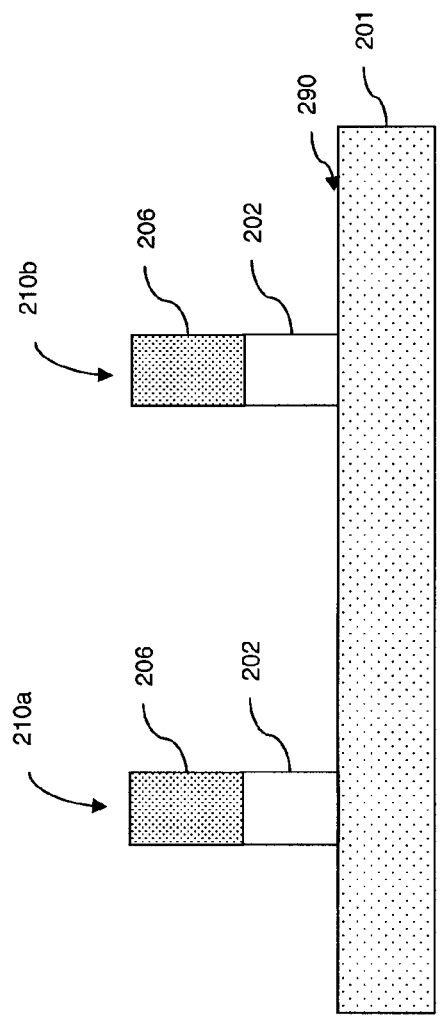
FIG. 15 is schematic diagram illustrating a partially completed semiconductor structure 200.

Then, multi-layer identical fins 210a-b can be formed into the wafer such that they extend vertically from the planar top surface 290 of the insulator layer (1306, see FIG. 15). Formation of these identical multi-layer fins 210a-b can be accomplished using conventional processing techniques. For example, a photoresist layer can be deposited onto the cap layer 206. The photoresist layer can then be lithographically patterned. Following lithographic patterning of the photoresist layer, multiple reactive ion etch (RIE) processes can be performed to selectively and directionally etch the nitride layer 206 and silicon layer 202, stopping at the isolation layer 201. Following, the selective RIE processes, the photoresist layer can be removed. Thus, each of the multi-layer fins 210a-b comprises portions of the semiconductor layer 202 and the nitride layer 206.

Figure 16:
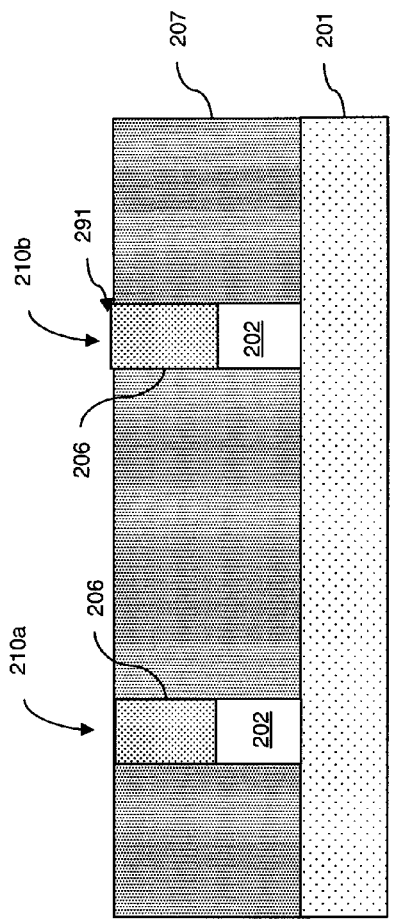
FIG. 16 is schematic diagram illustrating a partially completed semiconductor structure 200.

Once the identical multi-layer fins 210a-b are formed above the planar top surface 290 of the isolation layer 201, a sacrificial material 207 is deposited over the multi-layer fins 210a-b and planarized to expose the top surface 291 of the cap layer 206 (1308, see FIG. 16). The sacrificial material 207 can, for example, comprise a dielectric material, such as a high density plasma (HDP) oxide which has good filling characteristics so as to completely fill the narrow spaces between the fins 210a-b.

Figure 17:
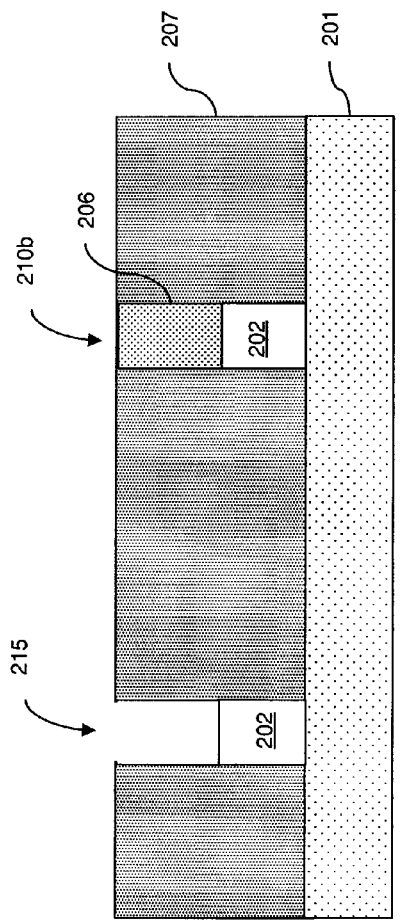
FIG. 17 is schematic diagram illustrating a partially completed semiconductor structure 200.

Then, the cap layer 206 is selectively removed from one of the multi-layer fins (e.g., fin 210a) such that a trench 215 is formed in the sacrificial material 207 (1310, see FIG. 17). This process 1310 can be accomplished, for example, by depositing a thin oxide layer over the wafer followed by an oxide disposable mask layer. The mask layer is lithographically patterned and the thin oxide layer is etched to expose the cap layer 206 of the fin 210a. Then, a wet nitride etch process (e.g., using hot phosphoric acid ($H_3PO_4$) is performed, which simultaneously removes the cap layer 206 from fin 210a and removes the mask layer from above the fin 210b, leaving the thin oxide layer.

This trench 215 is then filled with a semiconductor material 219 (1312, see FIG. 18). For example, the semiconductor material 219, such as a single crystalline silicon or single crystalline silicon germanium, can be epitaxially grown from the top surface 292 of the semiconductor layer 202 exposed at the bottom of the trench 215.

After the trench 215 is filled at process 1312, the cap layer 206 from another one of the multi-layer fins as well as the sacrificial material 207 can be selectively removed (1314). Specifically, the cap layer 206 (i.e., nitride layer 206 from fin 210b can be removed, for example, by using a wet (hot phosphoric acid ($H_3PO_4$)) etch process (see FIG. 19). Then, the sacrificial material 207 (i.e., HDP oxide) can be removed, for example, by using a wet (hydrofluoric acid (HF)) etch process (see completed structure 200 of FIG. 12). The resulting structure 200 comprises a first semiconductor fin 251 and a second semiconductor fin 252 on the planar top surface 291 of the insulator layer 201. Due to the processes 1302-1314, described above, the first semiconductor fin 251 will extend a first height 261 above the planar top surface 291 of the insulator layer 201, whereas the second semiconductor fin 261 will extend a second different height 262 above the planar top surface 291 of the insulator layer 201 (e.g., the second height 262 will be less than the first height 261).

Following completion of the semiconductor structure 200 of FIG. 12, additional conventional processing techniques are performed (e.g., gate oxide formation on the fin sidewalls, gate conductor deposition and patterning, source/drain extension formation, halo formation, spacer formation, source/drain region formation, deposition and planarization of a blanket dielectric layer, contact formation, etc.) so as to complete the FET structures having different effective channel widths on the same wafer and, optionally, within the same device (e.g., within a single static random access memory (SRAM) cell).

Therefore, disclosed above are embodiments of an improved semiconductor structure that comprises fins that are positioned on the same planar surface of a wafer and that have channel regions with different heights. In one embodiment the different channel region heights are accomplished by varying the overall heights of the different fins. In another embodiment the different channel region heights are accomplished by varying, not the overall heights of the different fins, but rather by varying the heights of a semiconductor layer within each of the fins. This embodiment has the advantage of simplifying subsequent lithographic processes, due to the fact that the top of each fin is at the same level. The disclosed semiconductor structure embodiments allow different multi-gate non-planar FETs (i.e., tri-gate or dual-gate FETs) with different effective channel widths to be formed of the same wafer. The disclosed method embodiments allow for accurate control of the different channel region heights and, thus, accurate control of the different effective channel widths for the individual FETs. The ability to accurately adjust the effective channel widths of individual FETs on the same wafer in turn allows the beta ratio of devices that incorporate multiple FETs (e.g., static random access memory (SRAM) cells) to be selectively adjusted.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, those skilled in the art will recognize that the embodiments of the invention described herein can be practiced with modification within the spirit and scope of the appended claims.

What is claimed is:

1. A semiconductor structure comprising:
   an isolation layer; and
   a first fin and a second fin on said isolation layer,
   wherein said first fin and said second fin have approximately equal overall heights,
   wherein said first fin and said second fin each comprise a semiconductor layer adjacent to said isolation layer and multiple additional layers above said semiconductor layer,
   wherein a first height of said semiconductor layer of said first fin is less than a second height of said semiconductor layer of said second fin, and
   wherein said semiconductor layer of said first fin comprises a single layer of semiconductor material and said semiconductor layer of said second fin comprises multiple layers of semiconductor materials.

2. The semiconductor structure of claim 1, wherein said single layer of semiconductor material of said first fin comprises a single layer of silicon.

3. The semiconductor structure of claim 1, wherein said multiple layers of semiconductor materials of said second fin comprise three layers of semiconductor materials comprising at least two different semiconductor materials.

4. The semiconductor structure of claim 1, wherein a first layer of said multiple layers of semiconductor materials of said second fin and said single layer of semiconductor material of said first fin have a same thickness.

5. The semiconductor structure of claim 1, wherein said multiple layers of semiconductor materials of said second fin comprise:
   a first layer of silicon;
   a layer of silicon germanium on said first layer of silicon; and
   a second layer of silicon on said layer of silicon germanium.

6. The semiconductor structure of claim 1, wherein multiple additional layers comprise a dielectric layer adjacent to said semiconductor layer and a conductor layer on said dielectric layer.

7. The semiconductor structure of claim 6, wherein said conductor layer comprises doped polysilicon germanium.

8. The semiconductor structure of claim 1, wherein said multiple additional layers comprise a first dielectric layer adjacent to said semiconductor layer and a second dielectric layer on said first dielectric layer.

9. A semiconductor structure comprising multiple tri-gate field effect transistors, said semiconductor structure comprising:
   an isolation layer; and
   a first fin for a first tri-gate field effect transistor and a second fin for a second tri-gate field effect transistor on said isolation layer,
   wherein said first fin and said second fin have approximately equal overall heights,
   wherein said first fin and said second fin each comprise:
      a semiconductor layer adjacent to said isolation layer;
      a dielectric layer above said semiconductor layer; and
      a conductor layer above said dielectric layer,
   wherein a first height of said semiconductor layer of said first fin is less than a second height of said semiconductor layer of said second fin, and
   wherein said semiconductor layer of said first fin comprises a single layer of semiconductor material and said semiconductor layer of said second fin comprises multiple layers of semiconductor materials.

10. The semiconductor structure of claim 9, wherein said single layer of semiconductor material of said first fin comprises a single layer of silicon.

11. The semiconductor structure of claim 9, wherein said multiple layers of semiconductor materials of said second fin comprise three layers of semiconductor materials comprising at least two different semiconductor materials.

12. The semiconductor structure of claim 9, wherein a first layer of said multiple layers of semiconductor materials of said second fin and said single layer of semiconductor material of said first fin have a same thickness.

13. The semiconductor structure of claim 9, wherein said multiple layers of semiconductor materials of said second fin comprise:
   a first layer of silicon;
   a layer of silicon germanium on said first layer of silicon; and
   a second layer of silicon on said layer of silicon germanium.

14. The semiconductor structure of claim 9, wherein said conductor layer of said first fin and said conductor layer of said second fin have different thicknesses.

15. The semiconductor structure of claim 14, wherein said conductor layer of both said first fin and said second fin comprises one of metal, doped polysilicon and doped polysilicon germanium.

16. A semiconductor structure comprising multiple fin-type field effect transistors, said semiconductor structure comprising:
   an isolation layer; and
   a first fin for a first fin-type field effect transistor and a second fin for a second fin-type field effect transistor on said isolation layer,
   wherein said first fin and said second fin have approximately equal overall heights,
   wherein said first fin and said second fin each comprise:
      a semiconductor layer adjacent to said isolation layer;
      a first dielectric layer above said semiconductor layer; and
      a second dielectric layer above said first dielectric layer, said first dielectric layer and said second dielectric layer comprising different dielectric materials,
   wherein a first height of said semiconductor layer of said first fin is less than a second height of said semiconductor layer of said second fin, and
   wherein said semiconductor layer of said first fin comprises a single layer of semiconductor material and said semiconductor layer of said second fin comprises multiple layers of semiconductor materials.

17. The semiconductor structure of claim 16, wherein said multiple layers of semiconductor materials of said second fin comprise three layers of semiconductor materials comprising at least two different semiconductor materials.

18. The semiconductor structure of claim 16, wherein a first layer of said multiple layers of semiconductor materials of said second fin and said single layer of semiconductor material of said first fin have a same thickness.

19. The semiconductor structure of claim 16, wherein said multiple layers of semiconductor materials of said second fin comprise:
   a first layer of silicon;
   a layer of silicon germanium on said first layer of silicon; and
   a second layer of silicon on said layer of silicon germanium.

20. The semiconductor structure of claim 16, wherein said second dielectric layer of said first fin and said second dielectric layer of said second fin have different thicknesses.

21. The semiconductor structure of claim 16, wherein, for both said first fin and said second fin, said first dielectric layer comprises an oxide and said second dielectric layer comprises a nitride.

* * * * *